(12) United States Patent
Laine et al.

(10) Patent No.: US 9,478,531 B2
(45) Date of Patent: Oct. 25, 2016

(54) SEMICONDUCTOR DEVICE COMPRISING AN ESD PROTECTION DEVICE, AN ESD PROTECTION CIRCUITRY, AN INTEGRATED CIRCUIT AND A METHOD OF MANUFACTURING A SEMICONDUCTOR DEVICE

(75) Inventors: Jean Philippe Laine, Cugnaux (FR); Patrice Besse, Tournefeuille (FR)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/419,029

(22) PCT Filed: Aug. 3, 2012

(86) PCT No.: PCT/IB2012/001650
§ 371 (c)(1),
(2), (4) Date: Feb. 2, 2015

(87) PCT Pub. No.: WO2014/020372
PCT Pub. Date: Feb. 6, 2014

(65) Prior Publication Data
US 2015/0221633 A1    Aug. 6, 2015

(51) Int. Cl.
*H01L 29/66*   (2006.01)
*H01L 27/02*   (2006.01)

(52) U.S. Cl.
CPC ....... *H01L 27/0259* (2013.01); *H01L 27/0277* (2013.01); *H01L 29/6625* (2013.01)

(58) Field of Classification Search
CPC ........... H01L 27/0259; H01L 29/6625; H01L 27/0277; H01L 27/0248
USPC .......... 257/47, 273, 423, 477; 438/170, 204, 438/234
See application file for complete search history.

(56) References Cited

U.S. PATENT DOCUMENTS

| | | | |
|---|---|---|---|
| 6,323,074 B1 * | 11/2001 | Jiang | H01L 27/0266 438/201 |
| 7,196,887 B2 | 3/2007 | Boselli et al. | |
| 7,548,401 B2 | 6/2009 | Mergens et al. | |
| 2003/0197242 A1 * | 10/2003 | Chen | H01L 21/82387 257/509 |
| 2004/0207021 A1 * | 10/2004 | Russ | H01L 29/7436 257/355 |
| 2004/0251502 A1 | 12/2004 | Reddy et al. | |
| 2005/0045952 A1 | 3/2005 | Chatty et al. | |
| 2006/0231895 A1 | 10/2006 | Duvvury et al. | |
| 2008/0044969 A1 | 2/2008 | Ker et al. | |

(Continued)

OTHER PUBLICATIONS

International Search Report and Written Opinion correlating to PCT/IB2012/001650 dated Mar. 20, 2013.

*Primary Examiner* — Jarrett Stark
*Assistant Examiner* — Shahed Ahmed
(74) *Attorney, Agent, or Firm* — Charlene R. Jacobsen

(57) ABSTRACT

A semiconductor device includes an ESD protection device. In a N-well, two P+ doped regions form a collector and emitter of a parasitic transistor of the ESD protection device. The N-well area between the P+ doped regions, forms a base of the parasitic transistor. At some distance away from the P+ doped regions an N+ doped region is provided. The N-well in between the N+ doped region and base of the transistor forms a parasitic resistor of the ESD protection device. The N+ doped region and the emitter of the transistor are coupled to each other via an electrical connection. The ESD protection device has a limited snapback behaviour and has a well-tunable trigger voltage.

12 Claims, 4 Drawing Sheets

(56) References Cited

U.S. PATENT DOCUMENTS

| | | | |
|---|---|---|---|
| 2009/0115018 A1 | 5/2009 | Mallikarjunaswamy | |
| 2010/0321840 A1* | 12/2010 | Bobde | H01L 27/0266 361/56 |
| 2011/0168782 A1* | 7/2011 | Bergler | H01L 23/5223 235/492 |
| 2012/0092798 A1* | 4/2012 | Hwang | H01L 27/0259 361/56 |
| 2013/0208379 A1* | 8/2013 | Wang | H01L 29/7436 361/56 |
| 2013/0279053 A1* | 10/2013 | Ritter | H01L 29/7436 361/56 |
| 2014/0027815 A1* | 1/2014 | Su | H01L 27/0262 257/146 |

\* cited by examiner

US 9,478,531 B2

SEMICONDUCTOR DEVICE COMPRISING AN ESD PROTECTION DEVICE, AN ESD PROTECTION CIRCUITRY, AN INTEGRATED CIRCUIT AND A METHOD OF MANUFACTURING A SEMICONDUCTOR DEVICE

FIELD OF THE INVENTION

This invention relates to.

BACKGROUND OF THE INVENTION

Electrostatic discharge (ESD) is a problem in the utilization, manufacturing and/or design of the semiconductor devices. The integrated circuits manufactured on the semiconductor device can be damaged when ESD events are received from other circuits coupled to the semiconductor device or from people and/or machinery and tools touching the semiconductor device. During an ESD event, the integrated circuit may receive a charge which leads to relatively large voltages during a relatively short period of time. If, for example, the integrated circuit breaks down as the result of the high voltage and starts to conduct the charge of the ESD event, a current of several amperes may flow through the integrated circuit during a relatively short period of time. These currents may cause irreparable damage to the integrated circuit.

Today most integrated circuit comprise ESD protection circuitries that are able to conduct the charge of an ESD event to, for example, the ground without causing irreparable damage to the integrated circuit. Such ESD protection circuits are typically arranged near the I/O pads of the semiconductor device and are configured to conduct the charge of the ESD event directly to the ground before the current may reach the vulnerable portions of the integrated circuit.

Published U.S. Pat. No. 7,196,887B2 discloses an ESD protection device as presented in the cross-sectional view of FIG. 2 of that document, which is FIG. 1a of the current application. In the known prior art device a PMOS transistor is manufactured in a N-doped substrate 116. The N-doped substrate may also be an N-well in a P doped substrate. In the following the term N-well is used for this area. The drain and the source of the PMOS transistor are formed by the P+ regions 118, 120 which are isolated from each other by the gate oxide 140 (e.g. polysilicon) above which the gate 124 of the PMOS transistor is provided. As seen in the FIG. 1a, the P+ regions 118, 120 are silicided (regions 132) for allowing a good electrical contact to metal contacts of the contact layer which may be manufactured on top of the substrate. The silicided regions are not present below the gate oxide 140 and the polysilicon regions 126 extending in a lateral direction from the gate. As discussed in the cited patent, the structure also comprises a parasitic lateral PNP transistor 106 of which the collector is formed by the P+ area 118, the emitter is formed by the P+ area 120, and the base is formed by the N-well formed in the substrate 116. According to the cited patent, the N-well may be connected to the IO pad or to the bulk voltage which is assumed to be 0 volts or a lower voltage.

The operational characteristics of the ESD protection device of FIG. 1a are presented in FIG. 1b, which is a copy of FIG. 4 of the cited patent. The x-axis represents a voltage received by the I/O pad. The y-axis represents a current which flows through the ESD protection device (from I/O pad to ground). At a first triggering point 404 at trigger voltage Vt1, the current conducted through the ESD protection device increases while the voltage across the ESD protection device reduces towards the holding point 406, which the voltage is often termed the holding voltage Vh. The difference between the trigger voltage Vt1 to the holding voltage Vh is often termed the snapback voltage Vsp. From the holding point 406 the current through the ESD protection device increases towards a second triggering point 408 at which the ESD device breaks down. The operational region between the threshold point 404 and the second triggering point 408 is often termed the snapback region. The term snapback refers to the phenomena that from the first threshold point 404 the voltage across the ESD protection device initially decreases and from the holding point 406 slowly increases. Many ESD protection devices have operational characteristics which are similar to the characteristics presented in FIG. 1b and typically have a snapback operational region. It is to be noted that the characteristics presented in FIG. 1b relate, according to the cited patent application, to the structure presented in FIG. 1a. Most ESD protection device which have a snapback operational region, have a first triggering voltage Vt1 that is higher than the second triggering voltage Vt2.

In many applications, a strong snapback behaviour is not desired and, in other application, even no snapback behaviour is allowed. Thus, in these applications the snapback voltage Vsp should be as small as possible. Consequently, the ESD protection device of the cited patent application can not be used in such applications.

SUMMARY OF THE INVENTION

The present invention provides a as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

Figure 2A:
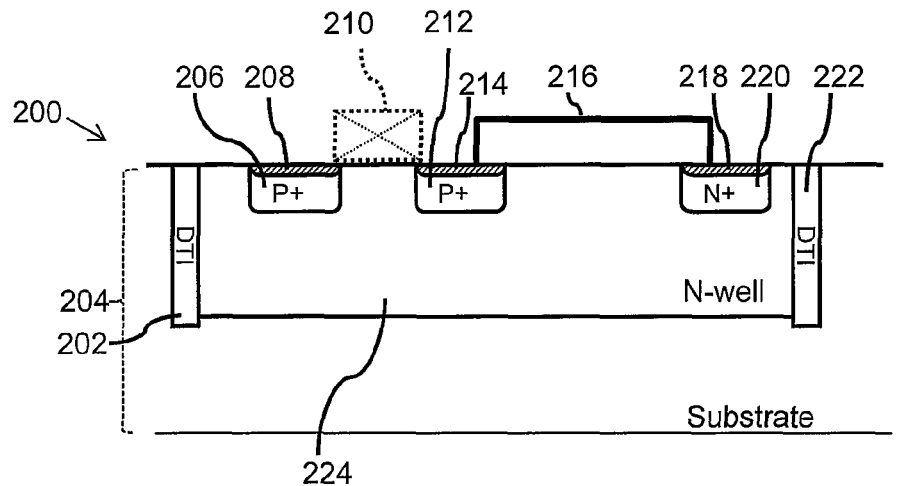

FIG. 2a schematically presents a cross-sectional view of an example of a structure of the ESD protection device 200 in a substrate 204. In the example of FIG. 2a the substrate 204 is of a P-type. In this P-type substrate 204, an isolated N-well 224 is created which is isolated from neighbouring structures by Deep Trench Isolation formed by structures 202, 222 (DPI). The N-well 224 is a region in the substrate 204 with a majority of N-dopants. The sheet resistance of the N-well 224 is at least 150 Ohmsq. In another embodiment, the sheet resistance of the N-well 224 is at least 300 Ohmsq. In yet a further embodiment, the sheet resistance of the N-well 224 is at least 1.5 kOhmsq. In an area of the N-well 224 an N+ region 220 is manufactured which has a higher N-dopants concentration than the N-well 224. The top-surface of the N+ region 220 is silicided 218 to allow a good electrical connection between the N+ region 220 and an electrical connection 216 which is manufactured in one of the other layers of a semiconductor device. Further, in the N-well 224 two P+-regions 206, 212 are also manufactured. The top surfaces of the P+ regions 206, 212 are also silicided 208, 214. The P+ regions 206, 212 have a relatively large amount of P dopants. In an embodiment, the P+ doping is larger than $1\cdot10^{19}$ atoms per $cm^3$. In between the P+ regions 206, 212 is an N-well region. Because the area between the P+ regions 206, 212 is not silicided, the two P+ regions 206, 212 are not electrically connected to each other. One of the P+ regions 212, which is the P+ region which is closest to the N+ region 220, is electrically connected to the N+ region 220 via an electrical connection 216 manufactured in other layers of the semi-conductor device. It is to be noted that no gate is present in the semiconductor device in the area indicated by area 210. Thus, no thin layer of gate oxide is deposited in area 210 and no electrically conductive material is present above a layer of gate oxide. In practical embodiments, an isolation layer is manufactured on top of the substrate 204 through which contacts are created to the P+ regions 206, 212 and the N+ region 220. Usually, when a gate is manufactured on top of the region in between the P+ regions 206, 212, a region of the Nwell 224 in between the P+ regions 206, 212 has a relatively high N-doping. In the ESD protection device 200 there is no need for such a high N-doping and, thus, the sheet resistance of the N-well 224 may be relatively large. Further, the area of a region of the Nwell 224 in between the P+ regions 206, 212 at the first side of the substrate 204 is unsilicided, which means, no silicidation is performed of this area.

In another optional embodiment, the substrate 204 is an N-doped substrate and no separate N-well area is present in the semiconductor substrate—hence, the N-doped substrate operates as an N-well and no other circuitry is created in this N-doped substrate. In yet another optional embodiment, the substrate 204 is an N-doped substrate and an area of the N-doped substrate is isolated by Deep Trench Isolation (DTI) to create an isolated N-doped region which operates as the N-well of the invention. In yet another embodiment, the N-well is created in a silicon on insulator technology, wherein a layer of silicon is isolated from other semiconductor material in the same semiconductor device by an insulator. In the context of the ESD protection devices according to this document, it is only important that the N-well is an isolated region. How this N-well is isolated from other components of the semiconductor device does not really matter.

Figure 2B:
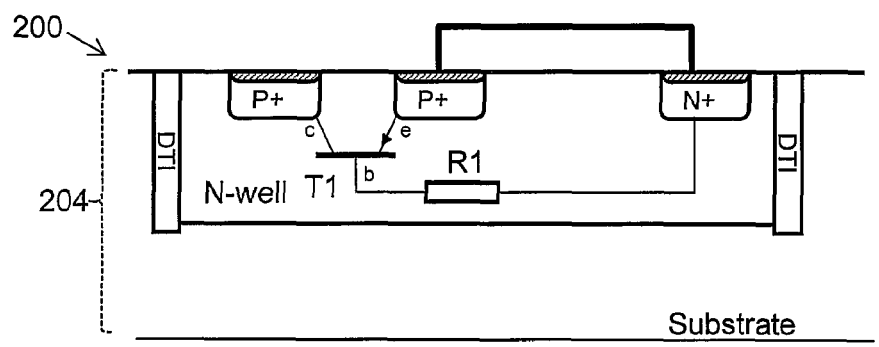

FIG. 2b schematically presents a parasitic transistor T1 and resistor R1 in the cross-sectional view of the structure of the ESD protection device 200. The electrical characteristics of the ESD protection device 200 are the result of the two parasitic electrical components which are formed by the structure in the substrate 204. The P-N and N-P junctions in the N-well 224 form a parasitic bipolar transistor T1. The N-well 224 itself forms a resistor R1 between the N+ region 220 (to which an electrical connection 216 is made) and the base of the transistor T1.

Figure 2C:
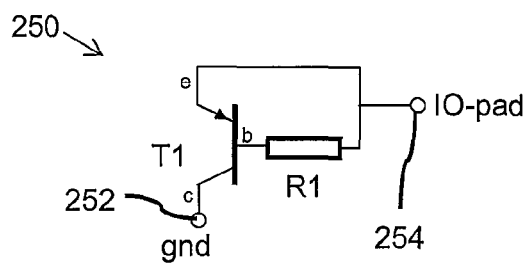

FIG. 2c schematically present the circuit diagram 250 of the ESD protection device 200. The circuit comprises a bipolar transistor T1 of which the collector is connected to terminal 252 which is to be connected to the gnd voltage (0 volts), or in specific applications to the lowest voltage present in the semiconductor device. The emitter of transistor T1 is connected to terminal 254 which is to be connected to the IO-pad that is configured to provide an electrical connection to other semiconductor device. The resistor R1 is connected between the base of the transistor T1 and the terminal 254. If the ESD device according to the invention is used to protect a circuitry for ESD events on the power lines, the terminal 254 is to be connected to the power line.

Figure 1A:
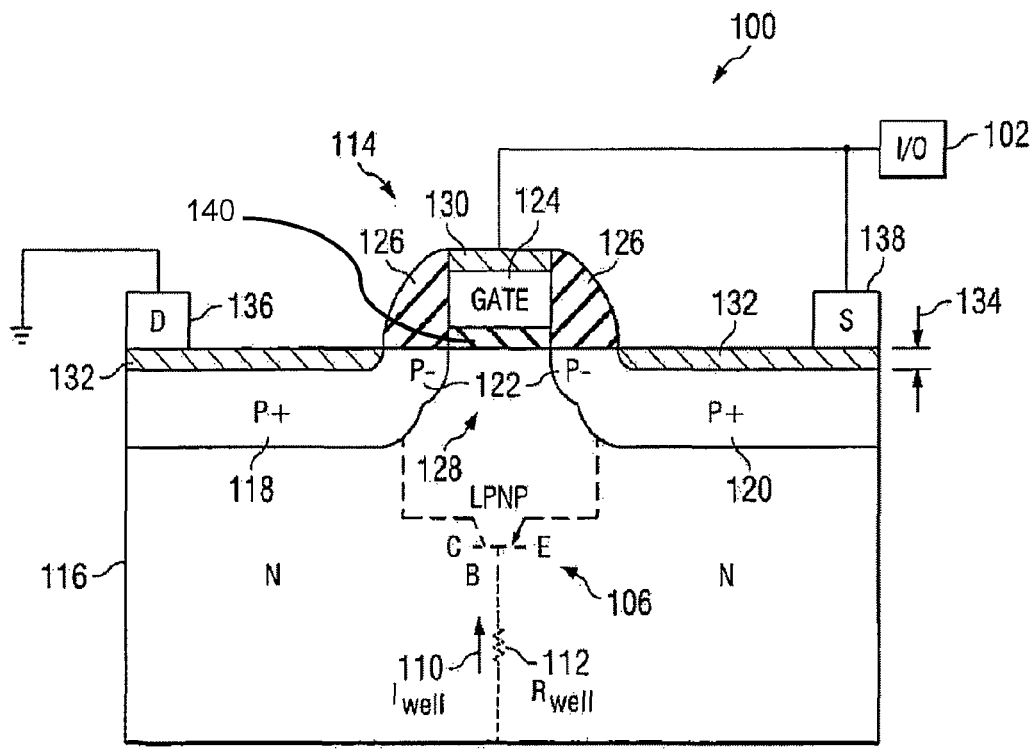
FIG. 1a schematically shows a structure of a prior art ESD protection device.
Figure 1B:
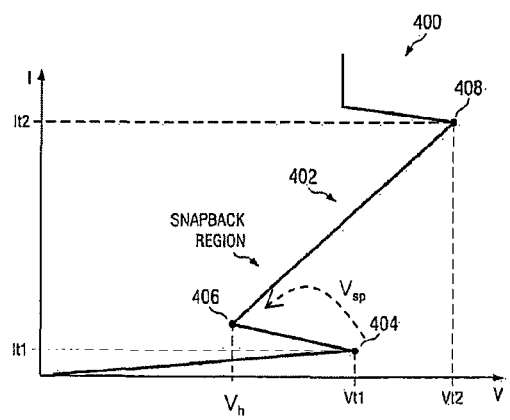
FIG. 1b schematically presents the operational characteristics of the prior art ESD protection device, FIG. 2a schematically presents a cross-sectional view of a structure of the ESD protection device in a semiconductor substrate, FIG. 2b schematically presents a parasitic transistor and a resistor in the cross-sectional view of the structure of the ESD protection device of FIG. 2a, FIG. 2c schematically presents the circuit diagram of the ESD protection device of FIG. 2a, FIG. 3 presents operational characteristic of an embodiment of the ESD protection device.

During an ESD event, no significant current flows from the N-well 224 to the ground gnd while the reverse biased region N-P+ junction of P+ region 206 remains below the breakdown voltage. At this time, the reversed biased junction can be considered as high impedance. Then, the current, generated by the ESD even, increases the voltage across this N-P+ junction until the breakdown voltage value is reached. Once the breakdown voltage value is reached, it leads to a creation of avalanche current generated by impact ionization. Holes are diverted to the P+ region 206 while electrons flows to the N+ region 220 via the N-well 224 to the P+ region 206. This electron current is flowing through the N-Well region which is resistive and it locally increases the voltage of the base of transistor T1 in the N-Well 224 (base) under P+ region 206 (emitter). Once the Emitter-base junction of the PNP is forwarded biased, at about 0.6V, then a bipolar effect appears and the PNP is activated. The breakdown voltage of the N-P+ junction is the trigger voltage Vt of the ESD protection device 200 (which has the same function as Vt1 of FIG. 1b). Subsequently, the transistor switches on and conducts current from the P+ region 212 (emitter transistor) to the P+ region 206 (collector) and, thus, to the ground. This prevents a fast further increase of the voltage of the ESD event and the impact of the ESD event on other parts of the circuitry is effectively reduced. Further, the switching on of the transistor T1 results in a relatively low snapback behaviour. With increasing currents through the transistor, the voltage between terminal 254 and terminal 252 linearly increases. The breakdown voltage of the N-P+ junction between the N-well 224 and the P+ region 206 depends on both the P+ doping and the concentration of N-dopants in the N-well 224 and is, thus, scalable. Different types of N-wells 224 may be used which are available for manufacturing different types of devices circuits. It may be an N-well from regular process to manufacture digital or analogue semiconductor devices, or from a high-voltage process. These different processes use different N-well dopings, thus, different N-dopant concentrations. The doping of the P+ region 206 and the N-well 224 doping are configured to obtain a predefined trigger voltage which is, in an optional embodiment, in between 5 and 15 volts. Semiconductor theory provides the relations between the breakdown=triggering voltage and the P+ doping and the N-well 224 doping.

Figure 3:
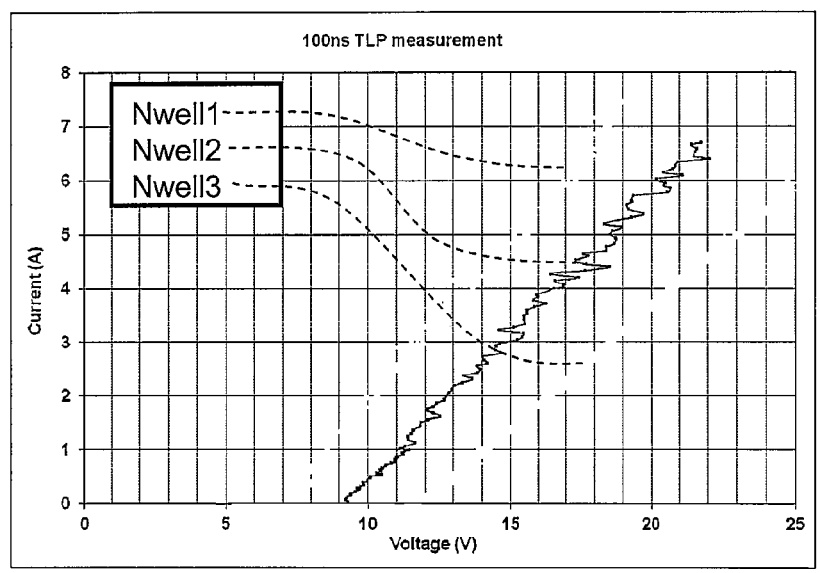

FIG. 3 presents the results of the tests with the ESD protection device 200 as presented in FIG. 2. The testing is performed with Transmission-line pulse testing (100 ns). The x-axis of the presented chart 300 represents the voltage between the I/O pad (emitter) combination of the ESD device and the ground voltage (thus, the voltage between terminals 252, 254). The y-axis represents the current through the ESD device of the FIG. 2. Three different ESD devices were tested, each with another N-well. Each different ESD device is represented by one of the abbreviations Nwell1, Nwell2, Nwell3. It is seen in the chart 300 that Nwell1, Nwell2 and Nwell3 (in combination with the respective P+ doping of the P+ region) have, respectively, a N-P+ junction breakdown voltage of 8.5, 9.5 and 10.5. It is to be noted that these breakdown voltage have the same function as the trigger voltage Vt1 of FIG. 1b. It is seen in the chart 300 that the ESD devices show a relatively small snapback behaviour from the moment in time that the transistor T1 starts to conduct, which means that the snapback voltage of the ESD devices is relatively low—this is different from the behaviour of the prior art ESD device, which have a significant snapback behaviour. In an embodiment, the snapback voltage is in between 0 to 1 volt. In another embodiment, the snapback voltage is in between 0 and 0.5 volt. Such a snapback voltage is especially advantageous in situations where the ESD device should not have the snapback behaviour. It is to be noted that, in line with the discussion in the background of the art section of this document, the snapback voltage is a difference between the trigger voltage Vt and the holding voltage Vh. In the prior art device of FIG. 1a, the N-well doping (at least between the P+ regions) is relatively high because (also) a PMOS transistor is manufactured and a gate is present above the region in between the two P+ regions. In the current embodiments, the N-well 224 doping is relatively small because no gate is present above the region in between the P+ regions 206, 212. The inventors do not want to be held to any specific theory, but they believe that the relatively low N-well doping, the absence of the gate oxide and the unsilicided area between the two P+ regions result in another complex avalanche mechanism than in the known embodiment of the background of the art, and, thus, the snapback voltage is relatively low. It is known from the cited document of the background of the art section, that the disclosed structure is a PMOS transistor. In order to manufacture a well-functioning PMOS transistor, the Nwell doping should be relatively large. In the embodiment of the current application, the Nwell doping is relatively large and is configured, together with the P doping of the P+ region 206, to define a predefined N-P+ junction breakdown voltage. Thus, the trigger voltage of the ESD protection device may be defined very accurately by choosing a specific Nwell doping and a specific P+ region doping.

Figure 4:
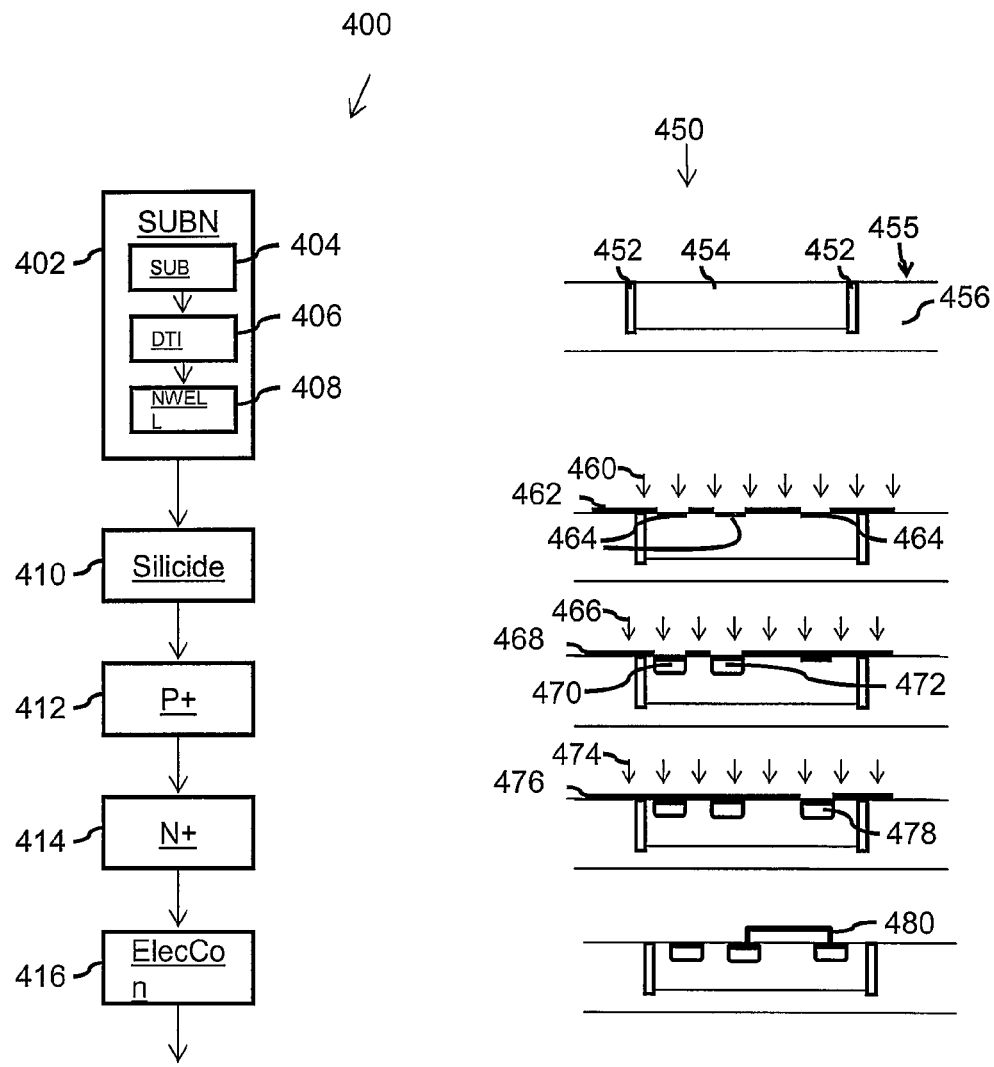
FIG. 4 presents an embodiment of a method of manufacturing a semiconductor device comprising an ESD protection device.

FIG. 4 presents an embodiment of a method 400 of manufacturing a semiconductor device comprising an ESD protection device. At the right side of FIG. 4 cross-sectional views of intermediate results 450 of the method are presented. In stage 402 a semiconductor substrate 456 is obtained which comprises an N-well region 454. The semiconductor substrate 456 comprises a surface 455 at a first side of the substrate 456. One side of the N-well region 454 touches the surface 455 and extends into the interior of the substrate 456 below the area where the N-well region 454 touches the surface. The stage of obtaining 402 the semiconductor substrate may optionally be subdivided in a stage of obtaining 404 a semiconductor substrate which is P doped and another stage of forming 408 an N-well region in the semiconductor substrate. Furthermore, the method may optionally comprise a stage of forming 406 an isolated region in the semiconductor substrate by forming a deep trench isolation 452. The Nwell is formed 408 in the isolated region. It is to be noted that in the context of the current application it does not really matter how the Nwell is formed. The only important characteristic of this Nwell is that no other circuitry may influence the electrical behaviour of this Nwell. Thus, the Nwell needs, in a way, be isolated from the other circuitry. This may be done by, for example, the mentioned Deep Trench Isolation, but an isolated N-well may also be created in a Silicon on Insulation (SOI) structure. Thus, the substrate which is used may be P+P− doped substrate, or a P− doped substrate only. It is to be noted that the sheet resistance of the Nwell is in accordance with previously discussed embodiments.

In another stage 410 areas 464 of the surface of the substrate are silicided. The areas correspond to areas where in other stages P+ and N+ regions are manufactured. In an optional embodiment, this may be done by creating a patterned photoresist layer 462 at the surface of the substrate by, for example, known photolithography techniques. When the patterned photoresist layer 462 is present at the surface, the silicidation of the areas, which are not covered by the photoresist layer 462, is performed. After the stage of silicidation, the photoresist layer 462 is removed.

In another stage 412 a first P+ doped region 470 and a second P+ doped region 472 are formed in the N-well region. In an optional embodiment this may be done by creating a patterned photoresist layer 468 at the surface of the substrate by, for example, known photolithography techniques. When the patterned photoresist layer 468 is present at the surface, P implantation 466 are implanted in the regions which are not covered by the pattered photoresist layer. After implanting the P implantation 466, the photoresist layer 468 is removed. It is to be noted that the P+ doping of the first P+ region is in accordance with previously discussed embodiments.

In another stage 414 an N+ doped region 478 is formed in the N-well region. In an optional embodiment this may be done by creating a patterned photoresist layer 476 at the surface of the substrate by, for example, known photolithography techniques. When the patterned photoresist 476 layer is present at the surface, N implantation 474 is implanted in the region which is not covered by the pattered photoresist layer. After implanting the P implantation 474, the photoresist layer 476 is removed.

It is to be noted that, in an optional embodiment, the steps of creating the P+ doped regions 470, 474 may also be performed after manufacturing the N+ region 478 in the N-well.

Optionally, the two P+ doped regions and the N+ doped region are arranged such that the second P+ doped region is in between the first P+ doped region and the N+ doped region.

In yet a further stage 416 an electrical connection 480 is manufactured between the second P+ doped region and the N+ doped region. This may be done, for example, by manufacturing contacts to the P+ doped region and the N+ doped region through an isolation layer which is manufactured on top of the surface and by creating an electrical connection between the contacts via a patterned metal layer which is subsequently manufactured on top of the isolation layer.

The above method of manufacturing the semiconductor is described as if it is a method of manufacturing a single ESD protection device. It is well known in the art that, during the described stages of the method, also other N-wells, P+ regions, N+ regions, etc., may be manufactured at other locations of the semiconductor substrate and, thus, the stages of the method may also be used to manufacture other parts of an integrated circuit as well.

The detailed description above is merely exemplary in nature and is not intended to limit the invention or the application and uses of the invention. Furthermore, there is no intention to be bound by any expressed or implied theory presented in the preceding technical field, background, or the following detailed description. In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be a type of connection suitable to transfer signals from or to the respective nodes, units or devices, for example via intermediate devices. Accordingly, unless implied or stated otherwise the connections may for example be direct connections or indirect connections.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

As used herein, the term "semiconductor" is intended to include any semiconductor whether single crystal, polycrystalline or amorphous and to include type IV semiconductors, non-type IV semiconductors, compound semiconductors as well as organic and inorganic semiconductors. Further, the terms "substrate" and "semiconductor substrate" are intended to include single crystal structures, polycrystalline structures, amorphous structures, thin film structures, layered structures as for example and not intended to be limiting, semiconductor-on-insulator (SOI) structures, and combinations thereof. The term "semiconductor" is abbreviated as "SC." For convenience of explanation and not intended to be limiting, semiconductor devices and methods of fabrication are described herein for silicon semiconductors but persons of skill in the art will understand that other semiconductor materials may also be used. Additionally, various device types and/or doped SC regions may be identified as being of N type or P type, but this is merely for convenience of description and not intended to be limiting, and such identification may be replaced by the more general description of being of a "first conductivity type" or a "second, opposite conductivity type" where the first type may be either N or P type and the second type then is either P or N type. Thus, the semiconductor substrate described herein can be any semiconductor material or combinations of materials, such as gallium arsenide, silicon germanium, silicon-on-insulator (SOI), silicon, monocrystalline silicon, the like, and combinations of the above.

The conductors or electrical connection as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. A semiconductor device comprising an ESD protection device for protecting an integrated circuit on the semiconductor device against ESD event received by the integrated circuit, the ESD protection device comprising:
    an N-well region arranged in a semiconductor substrate of the semiconductor device and having a surface at a first side of the substrate;
    a first P+ doped region that abuts the N-well region for forming a collector of a parasitic transistor;
    a second P+ doped region that abuts the N-well region for forming an emitter of the parasitic transistor, the second P+ doped region being separated from the first P+ doped region by a first portion of the N-well region;
    a N+ doped region that abuts the N-well region for providing an electrical contact with the N-well region, the N+ doped region being arranged at a larger distance from the first P+ doped region than from the second P+ doped region, the N+ doped region being separated from the second P+ doped region by a second portion of the N-well region; and an electrical connection between the second P+ doped region and the N+ doped region, the electrical connection being arranged in one or more layers which are arranged at the first side of the substrate, wherein no gate is present in a layers manufactured at the first side of the substrate above the first portion of the N-well region, the first side of the semiconductor substrate is unsilicided at the first portion of the N-well region, a P+ doping of the first P+ doped region and the N-well doping are configured to obtain a predefined trigger voltage for triggering the operation of the ESD protection device.

2. A semiconductor device according to claim 1, wherein the first P+ doped region, the second P+ doped region and the N+ doped region are silicided at the first side of the substrate, the first portion of the N-well region is not silicided.

3. A semiconductor device according to claim 1, wherein the predefined trigger voltage is in between 5 and 15 volts.

4. A semiconductor device according to claim 1, wherein the ESD protection device is configured to have a snapback voltage between 0 volt and 1 volt, wherein the snapback voltage of the ESD protection device is expressed as an amount by which the voltage across the ESD protection device is reduced after a start of the operation of the ESD protection device when the voltage across the ESD protection device has reached the predefined trigger voltage.

5. A semiconductor device according to claim 1, wherein the sheet resistance of the N-well region is at least 150 Ohms/sq.

6. A semiconductor device according to claim 1, wherein the P+ doping of at least the first P+ doped region is higher than $1 \cdot 10^{19}$ atoms/cm3.

7. A semiconductor device according to claim 1, wherein the N-well region is isolated from neighbouring structures.

8. A semiconductor device according to claim 7, wherein the N-well region is isolated by Deep Trench Isolation.

9. A semiconductor device according to claim 1, wherein the second P+ doped region is in between the first P+ doped region and the N+ doped region.

10. A semiconductor device according to claim 1, wherein the electrical connection is also coupled to an I/O pad of the semiconductor device for allowing the ESD protection device to catch ESD events received by the I/O pad.

11. A semiconductor device according to claim 1, wherein the first P+ doped region is electrically coupled to a ground voltage.

12. A semiconductor device according to claim 1, wherein the semiconductor substrate is P doped.

* * * * *